(12) United States Patent
Kudo et al.

(10) Patent No.: US 10,393,823 B2
(45) Date of Patent: Aug. 27, 2019

(54) BATTERY SYSTEM MONITORING APPARATUS

(71) Applicant: HITACHI AUTOMOTIVE SYSTEMS, LTD., Hitachinaka-shi, Ibaraki (JP)

(72) Inventors: Akihiko Kudo, Hitachinaka (JP); Tomonori Kanai, Hitachinaka (JP); Tomoyuki Arima, Hitachinaka (JP); Akiko Tsukamoto, Hitachinaka (JP)

(73) Assignee: HITACHI AUTOMOTIVE SYSTEMS, LTD., Hitachinaka-Shi, Ibaraki (JP)

( * ) Notice: Subject to any disclaimer, the term of this patent is extended or adjusted under 35 U.S.C. 154(b) by 0 days.

(21) Appl. No.: 15/548,565

(22) PCT Filed: Feb. 3, 2016

(86) PCT No.: PCT/JP2016/053128
§ 371 (c)(1),
(2) Date: Aug. 3, 2017

(87) PCT Pub. No.: WO2016/132895
PCT Pub. Date: Aug. 25, 2016

(65) Prior Publication Data
US 2018/0017631 A1 Jan. 18, 2018

(30) Foreign Application Priority Data
Feb. 18, 2015 (JP) .................................. 2015-029783

(51) Int. Cl.
*G01R 31/396* (2019.01)
*G01R 31/36* (2019.01)
(Continued)

(52) U.S. Cl.
CPC ........... *G01R 31/396* (2019.01); *G01R 19/00* (2013.01); *G01R 31/36* (2013.01); *H01M 10/48* (2013.01); *H02J 7/02* (2013.01)

(58) Field of Classification Search
CPC ............ G01R 31/3644; G01R 31/3658; G01R 31/362; G01R 31/36; G01R 19/00; H01M 10/48; H01M 10/482; H02J 7/02
See application file for complete search history.

(56) References Cited

U.S. PATENT DOCUMENTS

| 2004/0113589 A1* | 6/2004 | Crisp | H02J 7/0006 320/128 |
| 2010/0209748 A1* | 8/2010 | Kudo | H01M 10/425 429/91 |
| 2011/0074435 A1* | 3/2011 | Mizoguchi | G01R 35/00 324/433 |
| 2012/0146652 A1 | 6/2012 | Aoki et al. | |
| 2012/0186071 A1* | 7/2012 | Yamashita | H01G 11/06 29/593 |

(Continued)

FOREIGN PATENT DOCUMENTS

JP 2011-075504 A 4/2011
JP 2014-016254 A 1/2014
(Continued)

OTHER PUBLICATIONS

International Search Report dated May 24, 2016 as issued in corresponding International Application No. PCT/JP2016/053128.
(Continued)

*Primary Examiner* — Huy Q Phan
*Assistant Examiner* — Dustin R Dickinson
(74) *Attorney, Agent, or Firm* — Foley & Lardner LLP (57) ABSTRACT

An object is to achieve management control of an assembled battery using an accurate measured value of a cell voltage. A battery system monitoring apparatus 10 that monitors and
(Continued)

controls a battery system includes battery monitoring circuits 100 provided for respective cell groups 120. Each of the battery monitoring circuits 100 includes a cell voltage measurement module 6 that is connected with two electrodes of respective single battery cells 110 of a corresponding cell group 120 via voltage detection lines 2 and that measures a cell voltage of each of the single battery cells 110 at each of predetermined timings. An RC filter 4 is connected with the voltage detection lines 2. The RC filter 4 includes resistors and capacitors. The cell voltage measurement module 6 extends intervals at which the cell voltage is to be measured when a stored charge amount in the capacitor in the RC filter 4 changes.

7 Claims, 7 Drawing Sheets

(51) Int. Cl.
  *G01R 19/00* (2006.01)
  *H01M 10/48* (2006.01)
  *H02J 7/02* (2016.01)

(56) References Cited

U.S. PATENT DOCUMENTS

| | | |
|---|---|---|
| 2013/0265058 A1 | 10/2013 | Danner |
| 2014/0152261 A1 | 6/2014 | Yamauchi et al. |
| 2016/0061901 A1 | 3/2016 | Kudo et al. |

FOREIGN PATENT DOCUMENTS

| | | |
|---|---|---|
| WO | WO-2012/164761 A1 | 12/2012 |
| WO | WO-2014/171013 A1 | 10/2014 |

OTHER PUBLICATIONS

Extended European Search Report dated Oct. 19, 2018 in Application No. 16752282.0.

\* cited by examiner

BATTERY SYSTEM MONITORING APPARATUS

TECHNICAL FIELD

The present invention relates to an apparatus that monitors a battery system.

BACKGROUND ART

Hybrid electric vehicles (HEVs) and electric vehicles (EVs), for example, each commonly incorporate an assembled battery (battery system) that includes a plurality of single battery cells connected in series with each other in a secondary battery in order to achieve a desired high voltage. Such a traditional assembled battery includes a battery monitoring circuit that incorporates, for example, an integrated circuit connected with each of a predetermined number of single battery cells. The battery monitoring circuit performs, for example, measurement of a voltage across terminals of each single battery cell (cell voltage) and balancing discharge for equalizing residual capacity of each single battery cell to thereby monitor and manage a state of each single battery cell. During balancing, each single battery cell is discharged depending on the residual capacity thereof and a discharge current flows to a balancing resistor via a voltage detection line disposed between each single battery cell and the battery monitoring circuit. At this time, a voltage drop corresponding to the magnitude of an impedance occurs in the voltage detection line.

Recent years have witnessed practical application of single battery cells that exhibit fluctuations in voltage smaller than ever before with respect to a change in the residual capacity. Use of such a single battery cell requires measurement accuracy higher than before in order to make accurate estimation of the residual capacity through measurement of the cell voltage. Thus, in the measurement of the cell voltage during balancing, an effect from the abovementioned voltage drop in the voltage detection line is not negligible. Hence, a method for accurately measuring the cell voltage has been developed by correcting the voltage drop in the voltage detection line (see PTL 1).

CITATION LIST

Patent Literature

PTL 1: JP 2011-75504 A

SUMMARY OF INVENTION

Technical Problem

An ordinary assembled battery includes an RC filter disposed between the single battery cell and the battery monitoring circuit in order to minimize aliasing error occurring from noise or voltage fluctuations. Thus, when balancing is started or stopped, a resultant transient response corresponding to a time constant of the RC filter occurs in the cell voltage. Unfortunately, the method disclosed in PTL 1, while being capable of accurately measuring the cell voltage in a steady state following the start of balancing and the lapse of the transient response, is unable to accurately measure the cell voltage during the period of the transient response. It is thus difficult to achieve management control of the assembled battery using an accurate measured value of the cell voltage.

Solution to Problem

In one aspect of the present invention, a battery system monitoring apparatus is intended for monitoring and controlling a battery system that includes a plurality of cell groups, each cell group including a plurality of single battery cells connected in series with each other. The battery system monitoring apparatus includes a plurality of battery monitoring circuits provided for the respective cell groups. Each battery monitoring circuit includes a cell voltage measurement module that is connected with two electrodes of respective single battery cells of a corresponding cell group via voltage detection lines and that measures a cell voltage of each of the single battery cells at each of predetermined timings. The battery system monitoring apparatus further includes a filter circuit connected with the voltage detection lines. The filter circuit includes resistors and capacitors. In the battery system monitoring apparatus, the cell voltage measurement module extends intervals at which the cell voltage is to be measured when a stored charge amount in the capacitor in the filter circuit changes.

Advantageous Effects of Invention

According to the invention, management control of the assembled battery using an accurate measured value of the cell voltage can be achieved.

BRIEF DESCRIPTION OF DRAWINGS

FIGS. 6($a$) and 6($b$) are charts illustrating exemplary relations between cell voltage measurement timings and balancing control timings in one embodiment of the present invention.

DESCRIPTION OF EMBODIMENTS

Embodiments of the present invention will be described below with reference to the accompanying drawings. The embodiments to be described below illustrate examples in which the present invention is applied to a battery system monitoring apparatus that monitors a battery system incorporated in, for example, a hybrid electric vehicles (HEV). It is noted that the range over which the battery system monitoring apparatus according to the embodiments of the present invention is applicable is not limited only to the battery system incorporated in the HEV. The battery system monitoring apparatus according to the embodiments of the present invention is widely applicable also to apparatuses that monitor battery systems mounted, for example, in a plug-in hybrid electric vehicle (PHEV), an electric vehicle (EV), and a railroad vehicle.

The embodiments to be described below assume a lithium ion battery having a predetermined output voltage range, for example, an output voltage range of 3.0 to 4.2 V (average output voltage: 3.6 V) as a minimum unit of the battery system that is controlled and monitored by the battery system monitoring apparatus according to the embodiments of the present invention. The battery system monitoring apparatus according to the embodiments of the present invention may nonetheless control and monitor a battery system including any electricity storage/discharge device other than the lithium ion battery. Specifically, the battery system may be formed to include any type of electricity storage/discharge device when a need exists to restrict the use of the device when an SOC (state of charge) is too high (overcharge) or is too low (overdischarge). In the description that follows, the electricity storage/discharge devices as components of the battery system are collectively called "single battery cells".

In the embodiments to be described below, a plurality of (about several to dozen) single battery cells connected in series with each other is called a "cell group" and a plurality of cell groups connected in series with each other is called a "battery system". Further, the cell group and the battery system may sometimes be collectively called an "assembled battery".

First Embodiment

Figure 1:
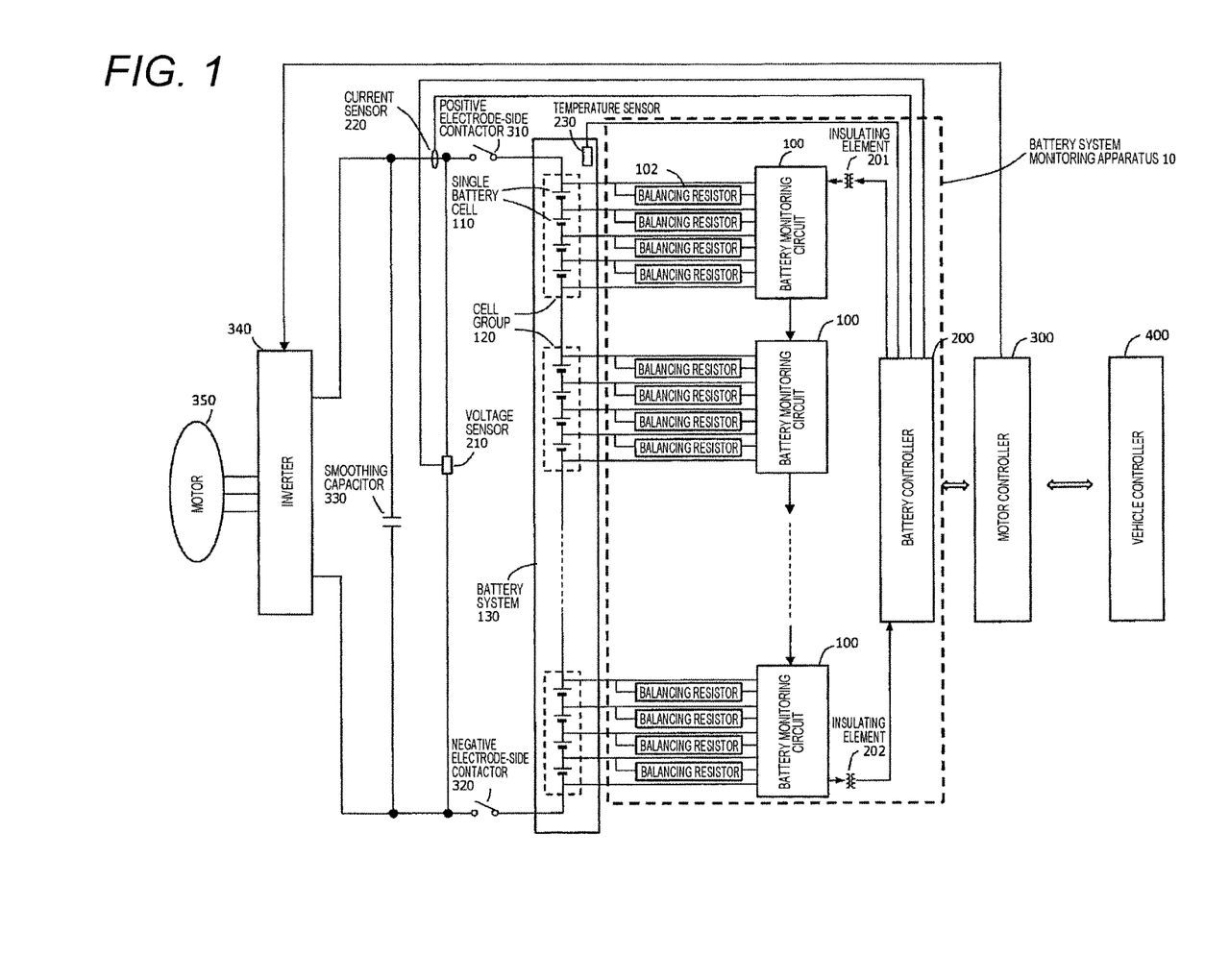
FIG. 1 is a diagram illustrating a configuration of a battery system monitoring apparatus according to an embodiment of the present invention.

FIG. 1 is a diagram illustrating a configuration of a battery system monitoring apparatus 10 according to an embodiment of the present invention. The battery system monitoring apparatus 10 includes a battery controller 200 and a plurality of battery monitoring circuits 100 that are connected with each other in accordance with a predetermined communication order. The battery system monitoring apparatus 10 is mounted, together with a vehicle controller 400, a motor controller 300, a battery system 130, an inverter 340, a motor 350, and the like, on an electrically driven vehicle such as an electric vehicle and a hybrid electric vehicle.

The battery system 130 includes a plurality of cell groups 120 connected in series with each other. The cell groups 120 each include a plurality of single battery cells 110 (hereinafter referred also to simply as cells) connected in series with each other. The cells 110 each include a secondary battery such as a lithium ion battery.

In the battery system monitoring apparatus 10, a loop-shaped communication circuit is disposed between the battery controller 200 and each of the battery monitoring circuits 100. The battery controller 200 transmits a communication signal via an insulating element 201 to a battery monitoring circuit 100 at the highest position in the communication order. The battery monitoring circuit 100 at the highest position in the communication order, having received the communication signal, transfers the communication signal to a battery monitoring circuit 100 at a position lower by one position in the communication order. Such an operation is sequentially performed in each of the battery monitoring circuits 100, so that the communication signal is transmitted in series from the battery monitoring circuit 100 at the highest position in the communication order to the battery monitoring circuit 100 at the lowest position in the communication order. The battery monitoring circuit 100 at the lowest position in the communication order transmits the communication signal to the battery controller 200 through an insulating element 202. The communication signal is thereby transmitted and received by the battery controller 200 and each of the battery monitoring circuits 100 via the loop-shaped communication circuit.

The vehicle controller 400 controls a running speed and braking and driving forces of a vehicle on the basis on an operation signal from a vehicle driving control device (not illustrated), such as an accelerator pedal, a brake pedal, or a gearshift lever operated by a driver of an electrically driven vehicle. The motor controller 300 controls the battery controller 200 and the inverter 340 on the basis of a speed command and braking and driving force commands from the vehicle controller 400 to thereby control a rotational speed and torque of the motor 350.

The battery controller 200 controls charging and discharging and the SOC (state of charge) of the battery system 130 on the basis of voltage, current, and temperature of the battery system 130 detected by a voltage sensor 210, a current sensor 220, and a temperature sensor 230, respectively. By transmitting and receiving the communication signal to and from each of the battery monitoring circuits 100 as described above, the battery controller 200 controls operation of each of the battery monitoring circuits 100 and estimates the SOC of the cells 110 constituting each of the cell groups 120 in the battery system 130. On the basis of the estimation result, discharge for correcting variations in the SOC between each of the cells 110 (hereinafter referred to as balancing discharge) is performed in order to prevent the SOC in each of the cells 110 from becoming uneven. The battery system monitoring apparatus 10 monitors and controls the battery system 130 in the foregoing manner.

Before exchanging the communication signal with each of the battery monitoring circuits 100 as described above, the battery controller 200 first outputs a start signal not illustrated to each of the battery monitoring circuits 100 to thereby start the battery monitoring circuit 100. The start signal is output via a signal path different from a signal path for conveying the communication signal. The transmission of the communication signal is started after the battery monitoring circuit 100 is determined to have been started.

It is noted that FIG. 1 illustrates, as the battery system 130, an assembled battery that includes a plurality of cell groups 120 connected in series with each other, each of the cell groups 120 including four cells 110 connected in series with each other. The number of cells 110 that constitute one cell group 120 is not, however, limited to four and may be less or more than four. Electrically driven vehicles including electric vehicles and hybrid electric vehicles typically include high-voltage, high-capacity battery modules having a voltage across both terminals of several hundreds of volts and including cells or cell groups connected in series or in parallel with each other. The present invention can be applied to such a high-voltage, high-capacity battery module.

The battery monitoring circuit 100 is provided for each of the cell groups 120 that represent the cells 110 constituting the battery system 130 and grouped into a predetermined number (four in FIG. 1) of groups. Consider, for example, a case in which one hundred cells 110 are connected in series with each other in the battery system 130 and the cells 110 are divided into groups, each group including four cells 110. In this case, the battery system 130 includes 25 cell groups 120 and, accordingly, the battery system monitoring apparatus 10 includes 25 battery monitoring circuits 100 disposed therein.

Each of the battery monitoring circuits 100 detects a voltage across terminals of a positive electrode and a negative electrode of each of the cells 110 that constitute a corresponding cell group 120 to thereby determine a cell voltage and transmits the measured cell voltage to the battery controller 200. The battery controller 200 estimates the SOC of each of the cells 110 on the basis of the measurement of the cell voltage of each of the cells 110 transmitted from the corresponding battery monitoring circuit 100 and outputs a balancing command to the corresponding battery monitoring circuit 100. The battery monitoring circuit 100 controls the flow of a balancing current for each of the cells 110 in accordance with the balancing command from the battery controller 200. A balancing resistor 102 for limiting to determine the balancing current is provided for each of the cells 110. The balancing resistors 102 are disposed between the battery monitoring circuit 100 and the corresponding cell group 120.

To drive a vehicle, DC power charged in the battery system 130 is supplied to a smoothing capacitor 330 and the inverter 340 through a positive electrode-side contactor 310 and a negative electrode-side contactor 320. The inverter 340 converts the DC power supplied from the battery system 130 into AC power and applies the AC power to the motor 350. The motor 350 is driven using the AC power. The inverter 340 is provided with a switching element (not illustrated) and switching the switching element causes the DC power to be converted into the AC power. To brake the vehicle, the AC power generated by the motor 350 is converted into DC power by a diode element (not illustrated) of the inverter 340 and the smoothing capacitor 330. The DC power is applied to the battery system 130 through the positive electrode-side contactor 310 and the negative electrode-side contactor 320, so that the battery system 130 is charged. The DC power is exchanged between the battery system 130 and the inverter 340 through the foregoing procedure.

It should be noted that the operation of the inverter 340 involves generation of ripple noise and switching noise. These noises, while being reduced to some extent by the smoothing capacitor 330, cannot be removed completely and flow into the battery system 130 to generate a noise current. In proportion to the noise current, a noise voltage is superimposed on the voltage across terminals of each of the cells 110 in the battery system 130. Because the noise assumes detection error of the cell voltage, an RC filter 4 illustrated in FIG. 2 to be described later suppresses the noise in the input to the battery monitoring circuit 100.

Figure 2:
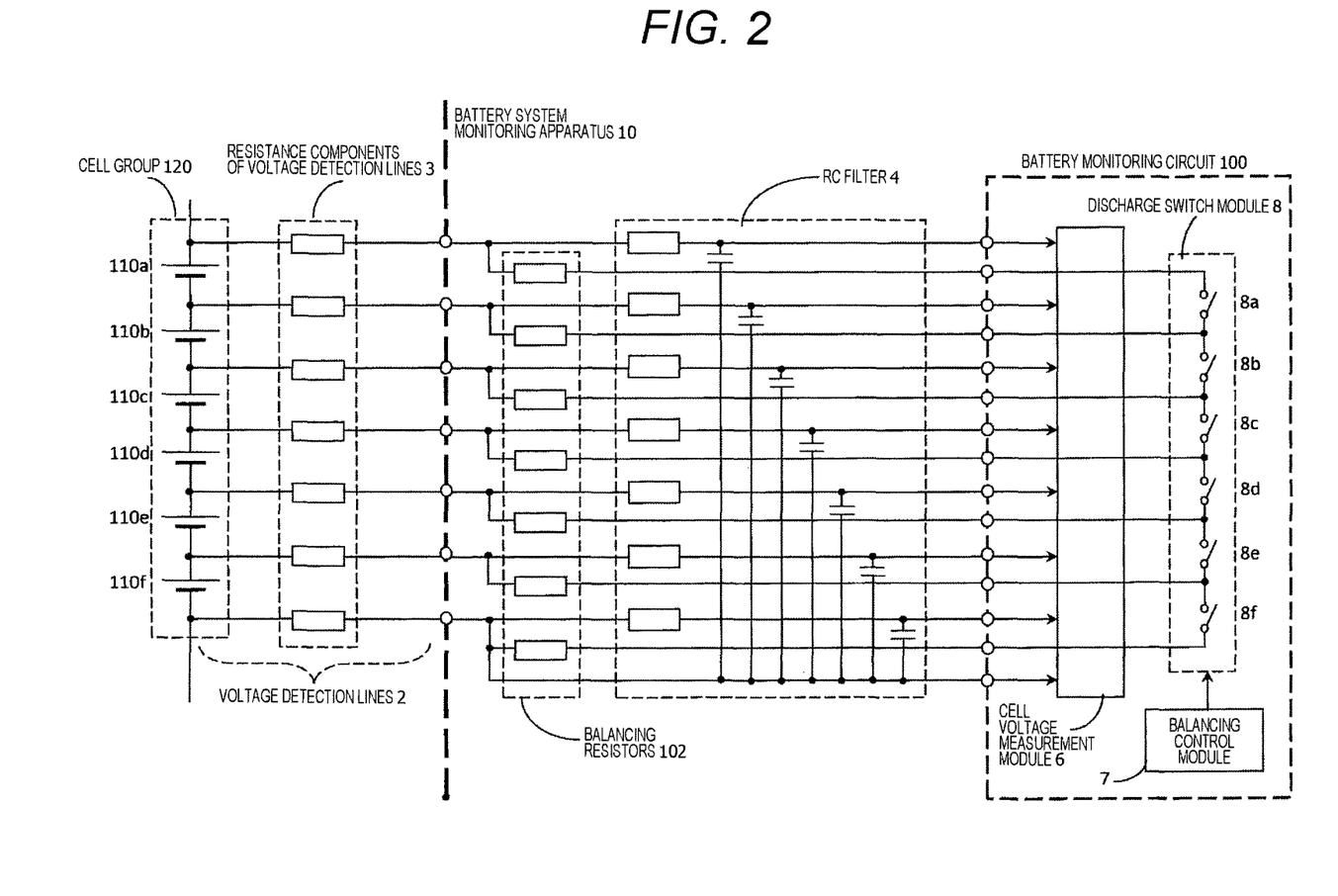
FIG. 2 is a diagram detailing a connection circuit between a cell group and a battery monitoring circuit according to a first embodiment of the present invention.

The following details a connection circuit between the cell groups 120 and the respective battery monitoring circuits 100 in the battery system monitoring apparatus 10 illustrated in FIG. 1. FIG. 2 is a diagram detailing the connection circuit between a cell group 120 and a corresponding battery monitoring circuit 100 according to the first embodiment of the present invention. The cell groups 120 and the respective battery monitoring circuits 100 disposed in correspondence with each other in FIG. 1 are each connected with each other via the connection circuit illustrated in FIG. 2. It is here noted that FIG. 2 illustrates six cells 110 constituting the cell group 120 and the six cells 110 are denoted cells 110a to 110f. The number of cells 110 that constitute the cell group 120 is, however, illustrative only and not limiting. For example, four cells 110 may be connected in series with each other as illustrated in FIG. 1.

Voltage detection lines 2 including resistance components 3 are connected with the cells 110a to 110f of the cell group 120 and the battery monitoring circuit 100 on the outside of the battery system monitoring apparatus 10. On the inside of the battery system monitoring apparatus 10, the balancing resistors 102 and the RC filters 4 are disposed between the cells 110a to 110f and the battery monitoring circuit 100. The RC filters 4 suppress noises that serves as the measurement error in the cell voltage as described previously. The RC filters 4 each include a resistor and a capacitor.

The battery monitoring circuit 100 functionally includes a cell voltage measurement module 6, a balancing control module 7, and a discharge switch module 8. The cell voltage measurement module 6 measures the cell voltage of each of the cells 110a to 110f applied thereto via the respective voltage detection lines 2 and RC filters 4 at predetermined timing. The cell voltage measured by the cell voltage measurement module 6 is transmitted to the battery controller 200 using the abovementioned communication signal.

The discharge switch module 8 includes discharge switches 8a to 8f that are associated with the respective cells 110a to 110f in FIG. 2. The balancing control module 7 switches an open/closed state of each of the discharge switches 8a to 8f in accordance with an instruction from the battery controller 200. The switching of the open/closed states of the discharge switches 8a to 8f by the balancing control module 7 changes states of discharge currents flowing from the cells 110a to 110f via the balancing resistors 102, causing the balancing discharge of the cells 110a to 110f to be performed.

Figure 3:
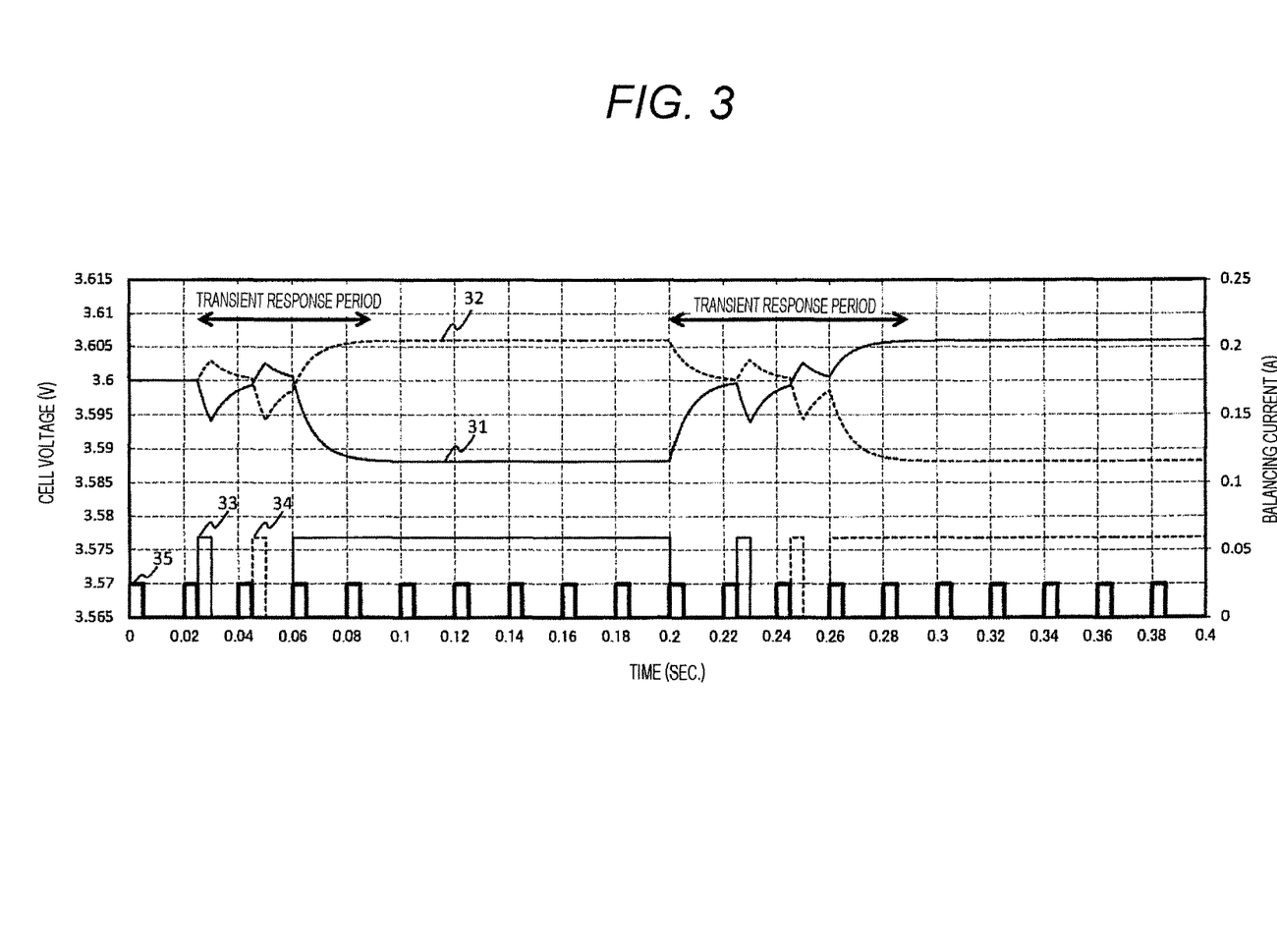
FIG. 3 is a diagram illustrating measurement timing of a cell voltage and exemplary change in a balancing current and the cell voltage.

The following describes a method for measuring the cell voltage by the cell voltage measurement module 6. FIG. 3 is a diagram illustrating timing of measurement of the cell voltage taken by the cell voltage measurement module 6 and exemplary change in the balancing current and the cell voltage. In FIG. 3, a waveform 31 indicated by the solid line in the upper half of FIG. 3 denotes a cell voltage of high-order cells and a waveform 32 indicated by the broken line in the upper half of FIG. 3 denotes a cell voltage of low-order cells. Additionally, a waveform 33 indicated by the solid line in the lower half of FIG. 3 denotes a balancing current flowing from the high-order cells through the balancing resistors 102 and a waveform 34 indicated by the broken line in the lower half of FIG. 3 denotes a balancing current flowing from the low-order cells through the balancing resistors 102. A waveform 35 denotes the cell voltage measurement timing. It is noted that the "high-order cells" refer to odd-numbered cells 110 counted from the high voltage side in the cell group 120 and correspond in FIG. 2 to the cells 110a, 110c, and 110e. The "low-order cells" refer to even-numbered cells 110 counted from the high-voltage side in the cell group 120 and correspond in FIG. 2 to the cells 110b, 110d, and 110f.

In FIG. 3, the ordinate on the left-hand side represents cell voltage values indicated by the waveforms 31 and 32 and the ordinate on the right-hand side represents the balancing current values indicated by the waveforms 33 and 34. The abscissa represents time used commonly with the waveforms 31 to 35.

As indicated by the waveform 35, the cell voltage measurement module 6 measures the cell voltage of each of the cells 110a to 110f at intervals of 0.02 sec. The balancing control module 7 controls the discharge switches 8a to 8f at timings in synchronism with the cell voltage measurement timings.

When the battery monitoring circuit 100 starts operation at time 0, the balancing control module 7 closes, immediately after the measurement of the cell voltage taken 0.02 seconds thereafter, the discharge switches 8a, 8c, and 8e that are associated with the high-order cells for only a brief period of time. Then, immediately after the subsequent cell voltage measurement timing thereafter, the balancing control module 7 closes the discharge switches 8b, 8d, and 8f that are associated with the low-order cells for only a brief period of time. At this time, the balancing current flows alternately in the high-order cells and the low-order cells as indicated by the waveforms 33 and 34. Detection of this balancing current allows the battery monitoring circuit 100 to detect an open circuit in the voltage detection lines 2.

The balancing control module 7 then controls the discharge switch associated with, out of the discharge switches 8a, 8c, and 8e that are associated with the high-order cells, a cell to be balanced to thereby bring the discharge switch into a closed state. This operation results in a positive electrode of the cell to be balanced being connected with a negative electrode of the cell to be balanced, out of the cells 110a, 110c, and 110e as the high-order cells, via the balancing resistor 102 and the cell in question is discharged and the balancing current flows as indicated by the waveform 33.

When the balancing discharge of the high-order cells is completed, the battery monitoring circuit 100 detects an open circuit in the voltage detection lines 2 again. At this time, the balancing control module 7 closes the discharge switches 8a, 8c, and 8e that are associated with the high-order cells and the discharge switches 8b, 8d, and 8f that are associated with the low-order cells alternately for only a brief period of time. The balancing control module 7 thereafter controls the discharge switches 8b, 8d, and 8f that are associated with the low-order cells in a manner similar to the control performed for the discharge switches 8a, 8c, and 8e that are associated with the high-order cells. Specifically, the balancing control module 7 controls the discharge switch associated with, out of the discharge switches 8b, 8d, and 8f that are associated with the low-order cells, a cell to be balanced to thereby bring the discharge switch into a closed state. This operation results in a positive electrode of the cell to be balanced being connected with a negative electrode of the cell to be balanced, out of the cells 110b, 110d, and 110f as the low-order cells, via the balancing resistor 102 and the cell in question is discharged and the balancing current flows as indicated by the waveform 34.

Switching the discharge switches 8a to 8f at the timings described above causes the cell voltages of the high-order cells and the low-order cells to be changed as indicated by the waveforms 31 and 32. Specifically, to detect an open circuit in the voltage detection lines 2, when the discharge switches 8a, 8c, and 8e that are associated with the high-order cells are first closed for only a brief period of time to thereby allow the balancing current to flow to the cells 110a, 110c, and 110e, then the cell voltages of the high-order cells decrease and the cell voltages of the low-order cells increase accordingly. When these discharge switches are returned to the open state, the balancing current becomes zero and the cell voltages of the high-order cells and the low-order cells change toward original levels thereof, respectively. Next, when the discharge switches 8b, 8d, and 8f that are associated with the low-order cells are closed for only a brief period of time to thereby allow the balancing current to flow to the cells 110b, 110d, and 110f, then the cell voltages of the low-order cells decrease and the cell voltages of the high-order cells increase accordingly. When these discharge switches are returned to the open state, the balancing current becomes zero and the cell voltages of the high-order cells and the low-order cells change toward the original levels thereof, respectively.

Following the detection of an open circuit in the voltage detection lines 2, balancing discharge of the high-order cells or the low-order cells is performed. In the balancing discharge of the high-order cells, the cell to be balanced is discharged to allow the balancing current to flow by closing the discharge switch 8a, 8c, or 8e. This operation causes the cell voltages of the high-order cells to decrease and the cell voltages of the low-order cells to increase accordingly. These cell voltages become steady at a predetermined level after a lapse of a predetermined period of time after the balancing current started flowing. Bringing the discharge switch in question back to an open state thereafter shuts off the balancing current and causes the cell voltages of the high-order cells and the low-order cells to change toward respective original levels.

In the balancing discharge of the low-order cells, the cell to be balanced is discharged to allow the balancing current to flow by closing the discharge switch 8b, 8d, or 8f. This operation causes the cell voltages of the low-order cells to decrease and the cell voltages of the high-order cells to increase accordingly. These cell voltages become steady at a predetermined level after a lapse of a predetermined period of time after the balancing current started flowing. Bringing the discharge switch in question back to an open state thereafter shuts off the balancing current and causes the cell voltages of the high-order cells and the low-order cells to change toward the respective original levels.

Switching the discharge switches 8a to 8f from the open state to the closed state, or vice versa, as described above causes the cell voltages to fluctuate transiently for a predetermined period of time thereafter. The period over which the cell voltages fluctuate transiently will hereinafter be referred to as a "transient response period". In the example illustrated in FIG. 3, the periods indicated in FIG. 3 correspond to the transient response periods. These periods each represent a period of time that starts when the discharge switches 8a, 8c, and 8e corresponding to the high-order cells are switched from the open state to the closed state to detect an open circuit in the voltage detection lines 2 and that ends when the cell voltages become steady during the balancing discharge of the high-order cells or the low-order cells. The length of the transient response period depends on a time constant of the RC filter 4.

The battery system monitoring apparatus 10 in the present embodiment allows for the fluctuations in the cell voltages during the transient response period and causes the cell voltage measurement module 6 to correct measurements of the cell voltages. The following provides details in this respect.

Figure 4:
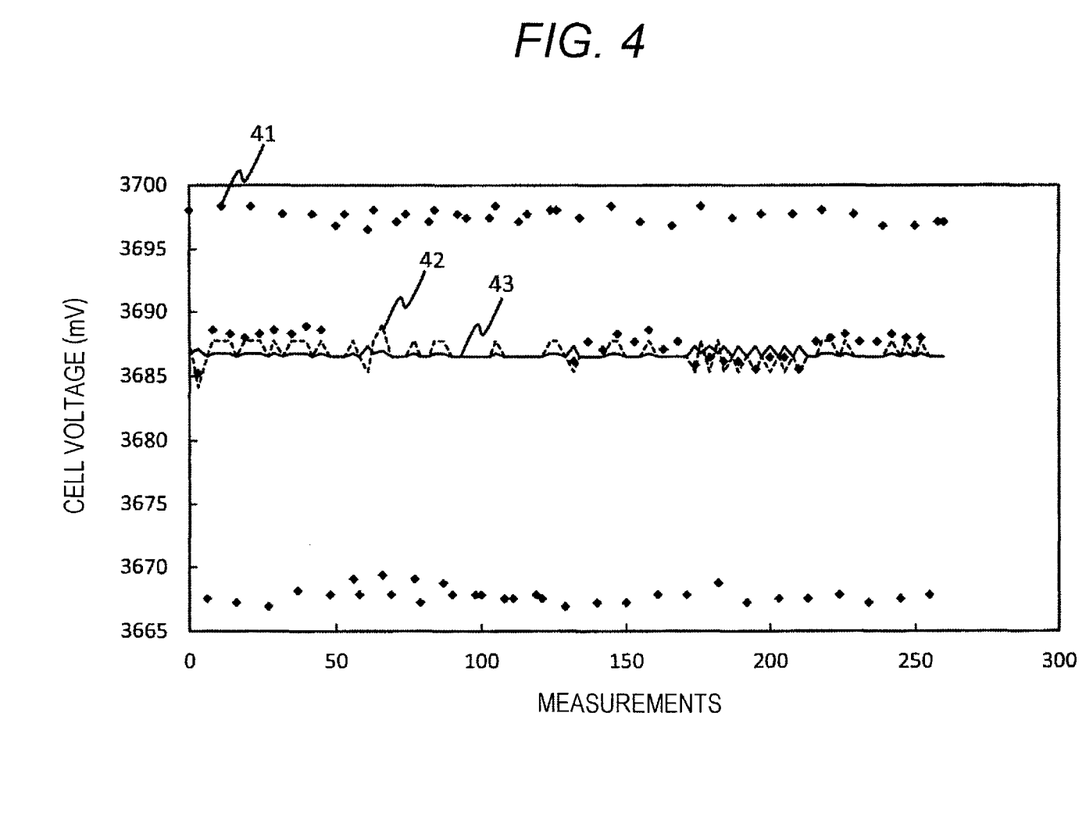
FIG. 4 is a chart illustrating exemplary results of corrections made of the cell voltages.

FIG. 4 is a chart illustrating exemplary results of corrections made of the cell voltages. In FIG. 4, points represented by the point denoted as 41 represent measured values of the cell voltages taken before the correction. The measured values of the cell voltages taken before the correction, which contain error caused by a voltage drop occurring from the balancing current flowing through the resistance components 3 illustrated in FIG. 2, vary in a vertical direction of the graph. In contrast, the broken line denoted as 42 represents the cell voltages after the correction made in accordance with a traditional correction method. The cell voltages after the correction are obtained by subjecting the measured values of the cell voltages before the correction to a correction made for the voltage drop by the resistance components 3. The correction made for the voltage drop by the resistance components 3 can reduce the error contained in the measured values of the cell voltages.

The solid line denoted as 43 represents the cell voltages after the correction obtained in the battery system monitoring apparatus 10 in the present embodiment. The battery system monitoring apparatus 10 causes the cell voltage measurement module 6 of the battery monitoring circuit 100 to correct the measured value of the cell voltage of each of the cells 110 for the voltage drop by the resistance component 3. At this time, a correction value that allows for fluctuations in the cell voltage as illustrated in FIG. 3 is used for the cell voltage measured during the transient response period. This approach can further reduce the error contained in the measured value of the cell voltage as compared with the traditional correction method.

When the time constant of the RC filter 4 involves variations, however, the cell voltage measured during the transient response period is susceptible to the variations in the time constant of the RC filter 4 and thus fluctuate. Thus, the correction made of the cell voltage as described above makes it difficult to find an accurate correction value of the cell voltage.

Figure 5:
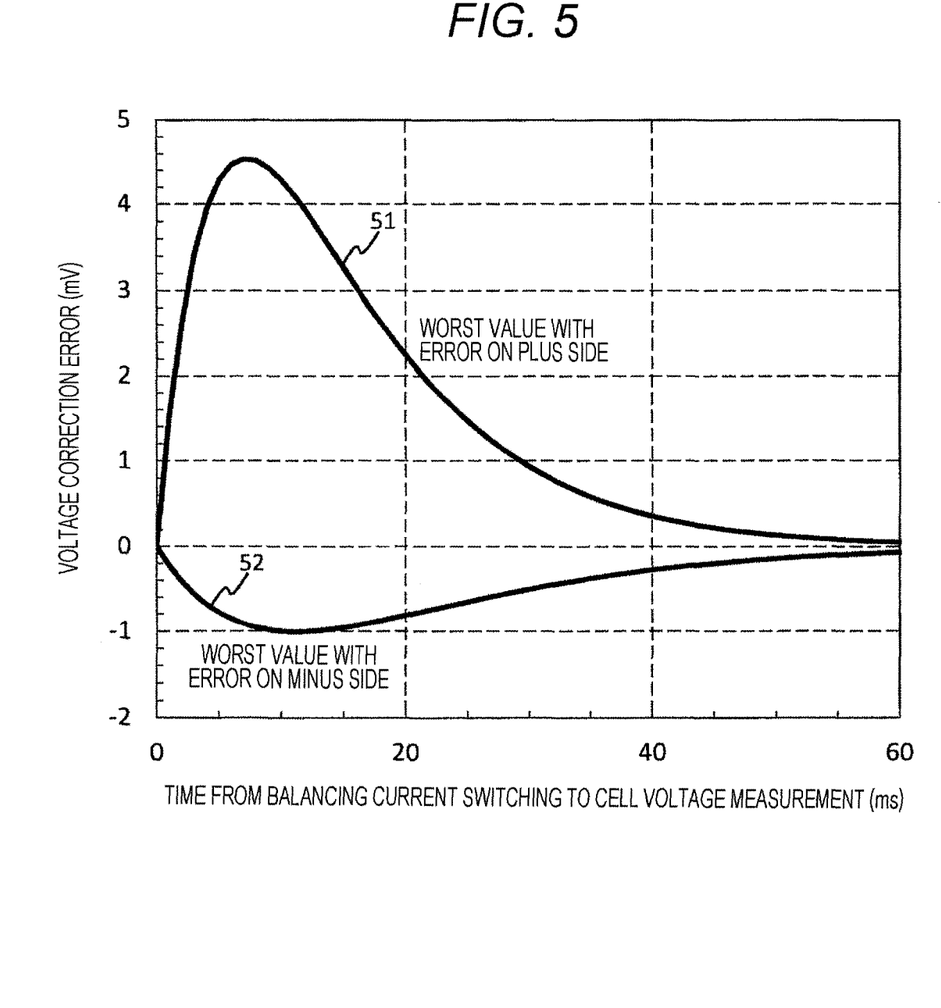
FIG. 5 is a characteristic diagram illustrating exemplary correction error of the cell voltage caused by variations in a time constant of an RC filter.

FIG. 5 is a characteristic diagram illustrating exemplary correction error of the cell voltage caused by variations in the time constant of the RC filter 4. In FIG. 5, a curve 51 represents a relation between a period of time extending from the switching of the balancing current to the time of measurement of the cell voltage and a worst value of the cell voltage correction error when the time constant of the RC filter 4 varies on the plus side. A curve 52 represents a relation between a period of time extending from the switching of the balancing current to the time of measurement of the cell voltage and a worst value of the cell voltage correction error when the time constant of the RC filter 4 varies on the minus side. It is noted that FIG. 5 illustrates a case in which the time constant of the RC filter 4 varies in the range of 10 ms±5 ms. As is known from FIG. 5, when the cell voltage is measured after the lapse of about 10 ms after the switching of the balancing current, the correction error in the cell voltage occurs in the range from about +4.5 mV to −1 mV.

The battery system monitoring apparatus 10 in the present embodiment thus changes the timing at which the cell voltage is measured such that the cell voltage is not measured for a predetermined period of time from the switching of the balancing current, during which the correction error in the cell voltage is great. The following describes a specific method for achieving the above end.

Figure 6:
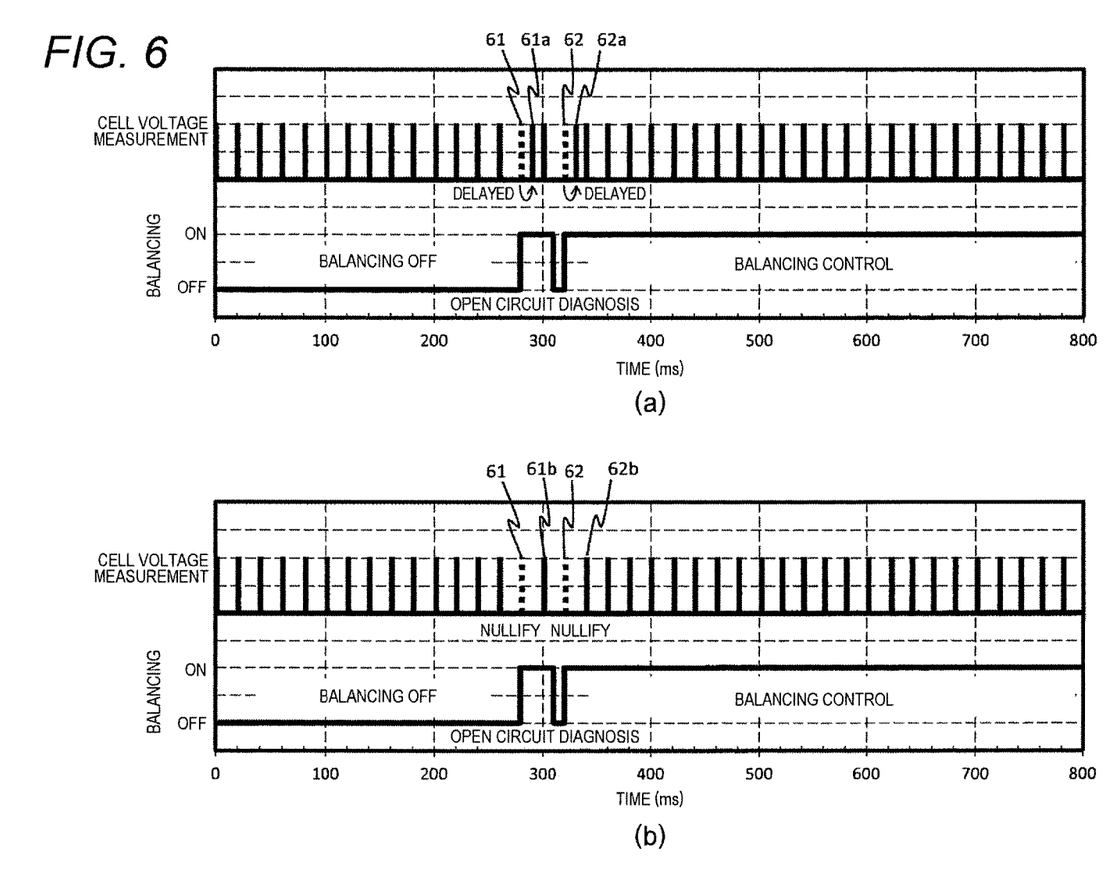

FIGS. 6(a) and 6(b) are charts illustrating exemplary relations between cell voltage measurement timings and balancing control timings in one embodiment of the present invention. The balancing control module 7 controls the discharge switches 8a to 8f as described previously to thereby perform a diagnosis of an open circuit in the voltage detection lines 2 and the balancing discharge at the timings indicated in FIGS. 6(a) and 6(b). Meanwhile, the cell voltage measurement module 6 measures the cell voltage of each of the cells 110 at intervals of 20 ms. At this time, the cell voltage measurement module 6 changes the timing at which the cell voltage is measured within a predetermined period of time from the switching of the balancing current by following either one of the methods illustrated in FIGS. 6(a) and 6(b).

FIG. 6(a) illustrates a case in which the timing at which the cell voltage is measured is delayed. As illustrated, for example, in FIG. 6(a), the cell voltage measurement module 6 delays a cell voltage measurement timing denoted as 61 at the start of an open circuit diagnosis and a cell voltage measurement timing denoted as 62 at the start of the balancing discharge by predetermined delay times, respectively. As a result, the cell voltage measurement timing immediately after the start of the open circuit diagnosis changes from the original measurement timing denoted as 61 to a delayed measurement timing denoted as 61a. Similarly, the cell voltage measurement timing immediately after the start of the balancing discharge changes from the original measurement timing denoted as 62 to a delayed measurement timing denoted as 62a.

As described above, the cell voltage measurement module 6 changes to delay the cell voltage measurement timing to thereby extend the intervals at which the cell voltage measurement is taken within the transient response period during which a stored charge amount in the capacitor of the RC filter 4 changes through the switching of the discharge current state using the discharge switches 8a to 8f. This arrangement prevents the cell voltage from being measured at timings at which the correction error in the cell voltage is great in the transient response period to thereby reduce the correction error. Moreover, use of the accurate cell voltage measured values obtained through the foregoing procedure enables the battery monitoring circuit 100 to appropriately monitor and control the cell group 120 associated therewith.

FIG. 6(b) illustrates a case in which the measured values of the cell voltages are nullified. As illustrated, for example, in FIG. 6(b), the cell voltage measurement module 6 nullifies a cell voltage measurement denoted as 61 at the start of an open circuit diagnosis and a cell voltage measurement denoted as 62 at the start of the balancing discharge. In this case, the cell voltage measurement module 6 may nullify the cell voltage measurement by skipping the cell voltage measurement, specifically, by not performing the measurement. Alternatively, the cell voltage measurement module 6 may nullify the cell voltage measurement by invalidating the obtained cell voltage measured value to thereby not using the measured value in subsequent processes. As a result, the cell voltage measurement timing immediately after the start of the open circuit diagnosis changes from the original measurement timing denoted as 61 to a next measurement timing denoted as 61b. Similarly, the cell voltage measurement timing immediately after the start of the balancing discharge changes from the original measurement timing denoted as 62 to a next measurement timing denoted as 62b.

As described above, the cell voltage measurement module 6 nullifies the cell voltage measurement to thereby extend the intervals at which the cell voltage measurement is taken within the transient response period during which the stored charge amount in the capacitor of the RC filter 4 changes through the switching of the discharge current state using the discharge switches 8a to 8f. This arrangement prevents the cell voltage from being measured at timings at which the correction error in the cell voltage is great in the transient response period, so that the correction error can be reduced. Moreover, use of the accurate cell voltage measured values obtained through the foregoing procedure enables the battery monitoring circuit 100 to appropriately monitor and control the cell group 120 associated therewith.

It is noted that the cell voltage measurement module 6 may execute a program stored in, for example, a memory not illustrated of the battery monitoring circuit 100 to thereby be able to measure the cell voltage at each predetermined measurement timing. The change of the cell voltage measurement timings described above can be achieved through settings made on the program. For example, the measurements are counted to identify the measurement timing corresponding to the transient response period and, at this particular measurement timing thus identified, a preset delay time is added to the ordinary measurement timing for measurement of the cell voltage. The foregoing procedure allows the cell voltage measurement timing in the transient response period to be delayed as illustrated in FIG. 6(a). Alternatively, the cell voltage measured at that particular measurement timing is output with a predetermined nullifying flag added thereto. This procedure allows the cell voltage measurement in the transient response period to be nullified as illustrated in FIG. 6(b). In addition to the foregoing, any other method can be employed to change the cell voltage measurement timing, including, for example, using a logic circuit.

The first embodiment of the present invention described above can achieve the following effects.

(1) The battery system 130 includes a plurality of cell groups 120 connected in series with each other, each cell group 120 including a plurality of single battery cells 110 connected in series with each other. The battery system monitoring apparatus 10 that monitors and controls the battery system 130 includes the battery monitoring circuits 100 that are associated with the respective cell groups 120. Each of the battery monitoring circuits 100 includes the cell voltage measurement module 6 that is connected with the two electrodes of each of the single battery cells 110 of the corresponding cell group 120 via the voltage detection lines 2 and that measures the cell voltage of the corresponding single battery cell 110 at each of predetermined timings. The RC filters 4, each including a resistor and a capacitor, are connected with the voltage detection lines 2. When the stored charge amount in the capacitor of the RC filter 4 changes, the cell voltage measurement module 6 extends the intervals at which the cell voltage is measured. With the foregoing arrangements, the battery system monitoring apparatus 10 can achieve management and control of the battery system 130 using the accurate cell voltage measured values.

(2) The battery system monitoring apparatus 10 further includes the balancing resistors 102 that are electrically connected with the voltage detection lines 2 and the RC filters 4 and that discharge the respective single battery cells 110 in the cell group 120 associated with the corresponding battery monitoring circuit 100. The battery monitoring circuit 100 includes the discharge switch module 8 that switches the state of the discharge current flowing from each of the single battery cells 110 of the cell group 120 associated with the battery monitoring circuit 100 through the corresponding balancing resistor 102 and the balancing control module 7 that controls the discharge switch module 8. The cell voltage measurement module 6 extends the intervals at which the cell voltage measurement is taken when the stored charge amount in the capacitor of the RC filter 4 changes through the switching of the discharge current state using the discharge switch module 8. More specifically, as illustrated in, for example, FIG. 6(a), the cell voltage measurement module 6 changes to delay the cell voltage measurement timing to thereby extend the intervals at which the cell voltage measurement is taken when the stored charge amount in the capacitor of the RC filter 4 changes. Alternatively, as illustrated in, for example, FIG. 6(b), the cell voltage measurement module 6 nullifies the cell voltage measurement to thereby extend the intervals at which the cell voltage measurement is taken when the stored charge amount in the capacitor of the RC filter 4 changes. The foregoing arrangements allow the intervals at which the cell voltage measurement is taken to be extended at any timing during an ongoing process of measurement of the cell voltage taken at predetermined intervals.

It is here noted that, when the cell voltage measurement module 6 attempts to change the timing at which the cell voltage measurement is taken as described above, an arrangement may be made to allow the balancing current to be changed after the measurement of the cell voltage, if the period of time from the cell voltage measurement to the switching of the balancing current is brief. Specifically, the balancing control module 7 may control the discharge switch module 8 such that the state of the discharge current can be changed after the measurement of the cell voltage by the cell voltage measurement module 6. This arrangement enables accurate measurement of the cell voltage through avoidance of fluctuations in the cell voltage during the transient response period.

Additionally, when the timing at which the cell voltage measurement is taken is delayed as illustrated in FIG. 6(a), the cell voltage measurement module 6 may advance the cell voltage measurement timing in a stepwise fashion until the original cell voltage measurement intervals are reached after the cell voltage measurement timing has been delayed. For example, after having delayed a cell voltage measurement timing by 15 ms, the cell voltage measurement module 6 delays the following cell voltage measurement timing by 10 ms and the second following cell voltage measurement timing by 5 ms. Thereby, the cell voltage measurement module 6 advances the cell voltage measurement timing in a stepwise fashion by 5 ms until the original measurement intervals are reached. The foregoing approach can prevent sudden fluctuations in the subsequent measurement timings to thereby reduce adverse effect on the management control of the battery system 130.

Second Embodiment

The following describes a second embodiment of the present invention. The first embodiment has been described for a case in which the cell voltage measurement timing is changed when the balancing current is switched. In contrast, the second embodiment will be described for a case in which the cell voltage measurement timing is changed when the connection state across the voltage detection lines is changed in the diagnosis by the cell voltage measurement module.

Figure 7:
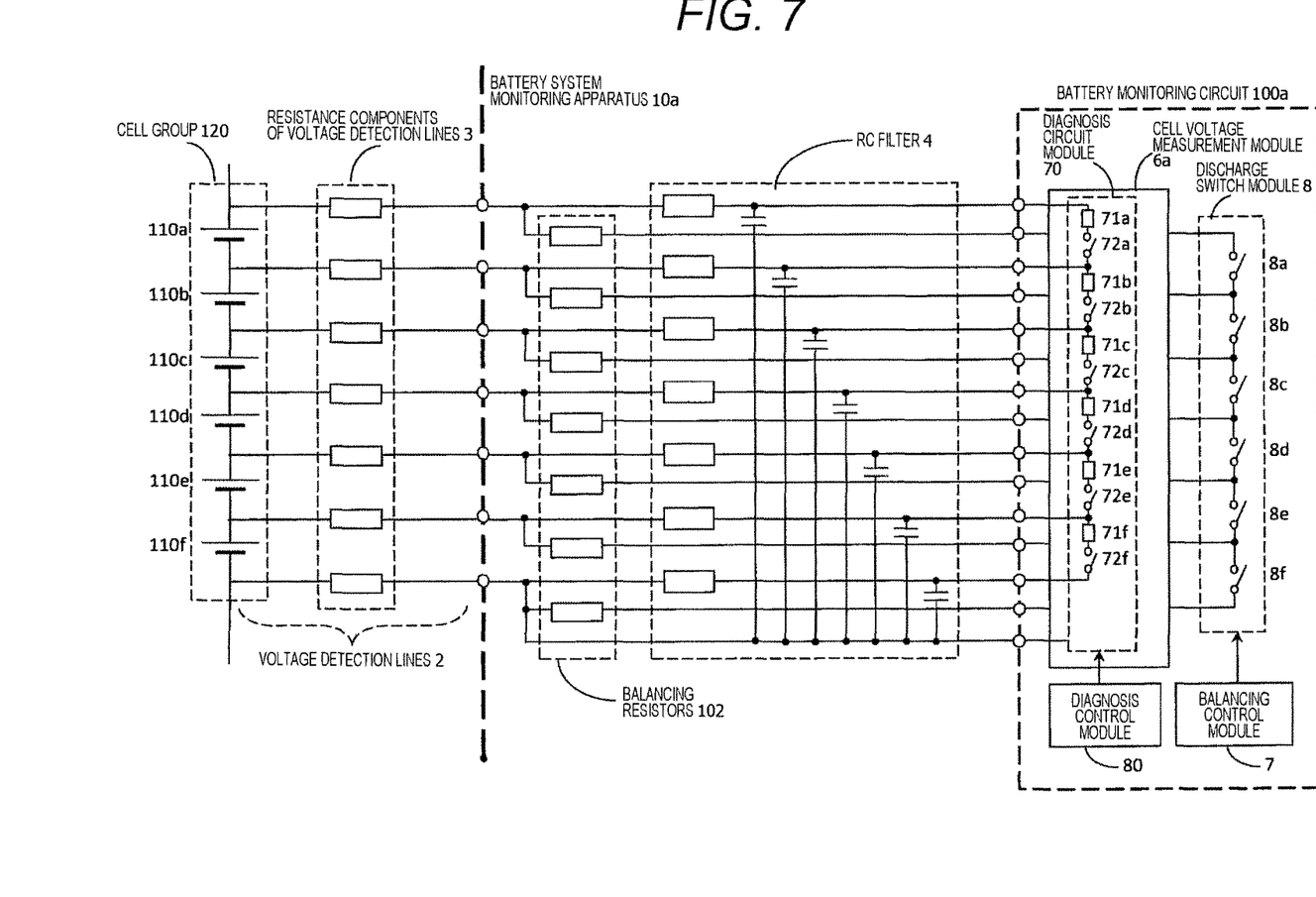
FIG. 7 is a diagram detailing a connection circuit between a cell group and a corresponding battery monitoring circuit according to a second embodiment of the present invention.

FIG. 7 is a diagram detailing a connection circuit between a cell group 120 and a corresponding battery monitoring circuit 100a according to the second embodiment of the present invention. A battery system monitoring apparatus 10a in the present embodiment includes, in place of the battery monitoring circuit 100 described in the first embodiment, the battery monitoring circuit 100a that is associated with a corresponding cell group 120. As illustrated in FIG. 7, the battery monitoring circuit 100a includes a cell voltage measurement module 6a in place of the cell voltage measurement module 6 illustrated in FIG. 2, and a diagnosis control module 80. It is noted that, for easier understanding of a configuration of the cell voltage measurement module 6a, FIG. 7 omits illustrating part of wires connecting to a discharge switch module 8 in the battery monitoring circuit 100a.

The cell voltage measurement module 6a includes a diagnosis circuit module 70. The diagnosis circuit module 70 is used for diagnosing the cell voltage measurement module 6a. The diagnosis circuit module 70 includes resistors 71a to 71f and diagnosis switches 72a to 72f associated, respectively, with respective cells 110a to 110f. The diagnosis control module 80 controls switching states of the diagnosis switches 72a to 72f as follows.

The battery monitoring circuit 100a diagnoses the cell voltage measurement module 6a in accordance with an instruction from a battery controller 200. When diagnosing the cell voltage measurement module 6a, the diagnosis control module 80 controls such that any one of the diagnosis switches 72a to 72f is switched from an OFF state to an ON state for only a brief period of time to thereby change the connection state across the voltage detection lines 2 connected with the two electrodes of the cell 110 in question associated with the diagnosis switch. The cell voltage measurement module 6a then measures the cell voltage of the cell 110 in question, specifically, a potential difference across the voltage detection lines 2 connected with the two electrodes, respectively, of the cell 110 in question. If the cell voltage measurement module 6a measures the cell voltage correctly at this time, a voltage drop in any one of the resistors 71a to 71f causes the cell voltage measured value to be changed before and after the switching. If, however, the cell voltage measurement module 6a is unable to measure the cell voltage correctly because of, for example, a wrong cell 110 not to be measured being selected, the cell voltage measured value does not change before and after the switching. Using this feature, the battery monitoring circuit 100a can diagnose the cell voltage measurement module 6a in terms of measurement of the cell voltage of the cell 110 in question. Furthermore, by diagnosing all cells 110a to 110f of the cell group 120 through a procedure similar to the foregoing, the battery monitoring circuit 100a can diagnose whether the cell voltage measurement module 6a measures the cell voltage correctly.

In the diagnosis of the cell voltage measurement module 6a described above, however, current flows through a capacitor in an RC filter 4 when the connection state across the voltage detection lines 2 is switched by a corresponding one of the diagnosis switches 72a to 72f. This current flow results in error occurring in the cell voltage measured value. To avoid the foregoing situation, the cell voltage needs to be prevented from being measured for a period of time during which the transient response period corresponding to the time constant of the RC filter 4 elapses after the connection state across the voltage detection lines 2 has been switched. This causes the diagnosis to take a long time. Indeed, the cell voltage measured value may be corrected using the method described with reference to the first embodiment; however, any variation in the time constant of the RC filter 4 makes it difficult to find an accurate correction value for the cell voltage as described previously.

Thus, the battery system monitoring apparatus 10a in the present embodiment changes the timing at which the cell voltage is measured to thereby prevent the cell voltage from being measured during a predetermined period of time after the connection state across the voltage detection lines 2 has been switched, during which the correction error in the cell voltage is great. More specifically, as with the case described with reference to FIG. 6(a), for example, the measurement of the cell voltage performed during the diagnosis of the cell voltage measurement module 6a is delayed by a predetermined delay time. Specifically, during the transient response period during which the stored charge amount in the capacitor of the RC filter 4 changes through the switching of the connection state across the voltage detection lines 2 using the discharge switches 72a to 72f in order for the cell voltage measurement module 6a to be diagnosed, the timing at which the cell voltage is measured is delayed and the intervals at which the cell voltage measurement is taken is thereby extended. Alternatively, as with the case described with reference to FIG. 6(b), for example, the measurement of the cell voltage performed during the diagnosis of the cell voltage measurement module 6a is nullified. Specifically, during the transient response period during which the stored charge amount in the capacitor of the RC filter 4 changes through the switching of the connection state across the voltage detection lines 2 using the discharge switches 72a to 72f in order for the cell voltage measurement module 6a to be diagnosed, the cell voltage measurements are nullified and the intervals at which the cell voltage measurement is taken is thereby extended. This arrangement prevents the cell voltage from being measured at timing at which the cell voltage correction error is great in the transient response period, to thereby reduce the correction error. Moreover, use of the accurate cell voltage measured values obtained through the foregoing procedure enables the battery monitoring circuit 100a to appropriately monitor and control the cell group 120 associated therewith.

It is noted that the cell voltage measurement module 6a may execute a program stored in, for example, a memory not illustrated of the battery monitoring circuit 100a to thereby be able to measure the cell voltage at each predetermined measurement timing. The change of the cell voltage measurement timings described above can be achieved through settings made on the program. In addition to the foregoing, any other method can be employed to change the cell voltage measurement timing, including, for example, using a logic circuit.

The second embodiment of the present invention described above can achieve the following effects.

(1) When the stored charge amount in the capacitor of the RC filter 4 changes, the cell voltage measurement module 6a extends the intervals at which the cell voltage is measured, as with the cell voltage measurement module 6 described with reference to the first embodiment. With the foregoing arrangements, the battery system monitoring apparatus 10a can achieve management and control of a battery system 130 using the accurate cell voltage measured values.

(2) The battery monitoring circuit 100a includes the diagnosis switches 72a to 72f for diagnosing the cell voltage measurement module 6a, each of the diagnosis switches 72a to 72f changing the connection state across the voltage detection lines 2 connected with the two electrodes of a corresponding single battery cell 110 of the cell group 120 associated with the battery monitoring circuit 100a, and the diagnosis control module 80 that controls the diagnosis switches 72a to 72f. The cell voltage measurement module 6a extends the intervals at which the cell voltage measurement is taken when the stored charge amount in the capacitor of the RC filter 4 changes through the switching of the connection state across the voltage detection lines 2 using the diagnosis switches 72a to 72f to thereby extend the intervals at which the cell voltage measurement is taken. More specifically, as illustrated in, for example, FIG. 6(a), the cell voltage measurement module 6a changes to delay the cell voltage measurement timing to thereby extend the intervals at which the cell voltage measurement is taken when the stored charge amount in the capacitor of the RC filter 4 changes. Alternatively, as illustrated in, for example, FIG. 6(b), the cell voltage measurement module 6a nullifies the cell voltage measurement to thereby extend the intervals at which the cell voltage measurement is taken when the stored charge amount in the capacitor of the RC filter 4 changes. The foregoing arrangements allow the intervals at which the cell voltage measurement is taken to be extended at any timing during an ongoing process of measurement of the cell voltage taken at predetermined intervals.

The embodiments and modifications described above are illustrative only and are not intended to limit the invention as far as the embodiments and modifications do not impair features of the invention.

REFERENCE SIGNS LIST 2 voltage detection line
3 resistance component
4 RC filter
6, 6a cell voltage measurement module
7 balancing control module
8 discharge switch module
10, 10a battery system monitoring apparatus
70 diagnosis circuit module
80 diagnosis control module
100, 100a battery monitoring circuit
102 balancing resistor
110 cell
120 cell group
130 battery system
200 battery controller
210 voltage sensor
220 current sensor
230 temperature sensor
300 motor controller
310 positive electrode-side contactor
320 negative electrode-side contactor
330 smoothing capacitor
340 inverter
350 motor
400 vehicle controller

The invention claimed is:

1. A battery system monitoring apparatus for monitoring and controlling a battery system, the battery system including a plurality of cell groups, each cell group including a plurality of single battery cells connected in series with each other, the battery system monitoring apparatus comprising:
   a plurality of battery monitoring circuits provided for the respective cell groups, each battery monitoring circuit including a cell voltage measurement module that is connected with two electrodes of respective single battery cells of a corresponding cell group via voltage detection lines and that measures a cell voltage of each of the single battery cells at each of predetermined timings; and
   a filter circuit connected with the voltage detection lines, the filter circuit including resistors and capacitors, wherein
   the cell voltage measurement module extends intervals at which the cell voltage is to be measured by the cell voltage measurement module when a stored charge amount in a capacitor in the filter circuit changes.

2. The battery system monitoring apparatus according to claim 1, further comprising:
   balancing resistors connected electrically with the voltage detection lines and the filter circuit, the balancing resistors discharging each of the single battery cells in the cell group associated with the corresponding battery monitoring circuit, wherein
   the battery monitoring circuit includes: a discharge switch that changes a state of a discharge current flowing from each of single battery cells in the cell group associated with the battery monitoring circuit via a corresponding balancing resistor; and a balancing control module that controls the discharge switch, and
   when the stored charge amount in the capacitor in the filter circuit changes by the switching of the state of the discharge current by the discharge switch, the cell voltage measurement module extends the intervals at which the cell voltage is to be measured.

3. The battery system monitoring apparatus according to claim 2, wherein the balancing control module controls the discharge switch such that the state of the discharge current can be changed after the cell voltage measurement module has measured the cell voltage.

4. The battery system monitoring apparatus according to claim 1, wherein
   the battery monitoring circuit includes, for diagnosing the cell voltage measurement module, a diagnosis switch that changes a connection state across the voltage detection lines connected with the two electrodes of each of the single battery cells in the cell group associated with the battery monitoring circuit and a diagnosis control module that controls the diagnosis switches, and
   when the stored charge amount in the capacitor in the filter circuit changes by the switching of the connection state across the voltage detection lines by the diagnosis switch, the cell voltage measurement module extends the intervals at which the cell voltage is to be measured.

5. The battery system monitoring apparatus according to claim 4, wherein the cell voltage measurement module extends the intervals at which the cell voltage is to be measured by changing to delay measurement timings of the cell voltage when the stored charge amount in the capacitor in the filter circuit changes.

6. The battery system monitoring apparatus according to claim 5, wherein the cell voltage measurement module advances the measurement timings of the cell voltage in a stepwise fashion until original intervals at which the cell voltage is to be measured are reached after the measurement timings of the cell voltage have been delayed.

7. The battery system monitoring apparatus according to claim 4, wherein the cell voltage measurement module extends the intervals at which the cell voltage is to be measured by nullifying measurements of the cell voltage when the stored charge amount in the capacitor in the filter circuit changes.

* * * * *